(12) United States Patent
Wan et al.

(10) Patent No.: US 11,854,931 B2
(45) Date of Patent: Dec. 26, 2023

(54) STIM/LIQUID METAL FILLED LASER DRILL TRENCH TO IMPROVE COOLING OF STACKED BOTTOM DIE

(71) Applicant: Intel Corporation, Santa Clara, CA (US)

(72) Inventors: Zhimin Wan, Chandler, AZ (US); Chia-Pin Chiu, Tempe, AZ (US); Peng Li, Chandler, AZ (US); Shankar Devasenathipathy, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 858 days.

(21) Appl. No.: 16/721,807

(22) Filed: Dec. 19, 2019

(65) Prior Publication Data

US 2021/0193548 A1   Jun. 24, 2021

(51) Int. Cl.
*H01L 23/367* (2006.01)
*H01L 25/065* (2023.01)
(Continued)

(52) U.S. Cl.
CPC ........ *H01L 23/367* (2013.01); *H01L 21/4853* (2013.01); *H01L 21/56* (2013.01); *H01L 23/3736* (2013.01); *H01L 23/42* (2013.01); *H01L 23/5386* (2013.01); *H01L 24/32* (2013.01); *H01L 25/0652* (2013.01); *H01L 25/50* (2013.01); *H01L 2224/32225* (2013.01); *H01L 2225/06589* (2013.01)

(58) Field of Classification Search
CPC ... H01L 23/367; H01L 23/3736; H01L 23/42; H01L 23/5386; H01L 23/3121; H01L 21/4853; H01L 21/56; H01L 24/32; H01L 25/0652; H01L 25/50; H01L 25/0657; H01L 25/06589; H01L 25/06517; H01L 2224/32225; H01L 2924/15192; H01L 2924/15311; H01L 2924/15312; H10B 80/00; H10K 39/10; H10K 39/12; H10K 39/15; H10K 39/18; H10K 39/601; H10K 39/621; H10K 59/90; H10K 59/95; H10N 19/00; H10N 39/00; H10N 59/00; H10N 69/00; H10N 79/00; H10N 89/00
USPC .................................. 257/668, 773, 777
See application file for complete search history.

(56) References Cited

U.S. PATENT DOCUMENTS

2021/0118756 A1\* 4/2021 Wan .................. H01L 23/49861
2021/0193552 A1\* 6/2021 Wan .................... H01L 23/3121

\* cited by examiner

*Primary Examiner* — Jasmine J Clark
(74) *Attorney, Agent, or Firm* — Schwabe, Williamson & Wyatt, P.C.

(57) ABSTRACT

Embodiments include semiconductor packages and a method to form such packages. A semiconductor package includes first and second bottom dies on a package substrate. The semiconductor package includes first top dies on the first bottom die, second top dies on the second bottom die, and a pedestal on the first and second bottom dies. The pedestal comprises a high thermal conductive material and is positioned on a region of top surfaces of the first and second bottom dies. The semiconductor package includes an encapsulation layer over the first and second bottom dies, and surrounds the first and second top dies and the pedestal. The semiconductor package includes a TIM over the first and second top dies, pedestal, and encapsulation layer, and an integrated heat spreader (IHS) over the TIM. The pedestal is on a periphery region of the top surfaces of the first and second bottom dies.

25 Claims, 10 Drawing Sheets

(51) Int. Cl.
*H01L 23/42* (2006.01)
*H01L 23/373* (2006.01)
*H01L 23/538* (2006.01)
*H01L 25/00* (2006.01)
*H01L 21/56* (2006.01)
*H01L 21/48* (2006.01)
*H01L 23/00* (2006.01)

STIM/LIQUID METAL FILLED LASER DRILL TRENCH TO IMPROVE COOLING OF STACKED BOTTOM DIE

FIELD

Embodiments relate to packaging semiconductor devices. More particularly, the embodiments relate to semiconductor devices that include trenches filled with high thermal interface materials (TIMs) to improve the cooling of the stacked bottom dies.

BACKGROUND

For the past several decades, the scaling of features in integrated circuits (ICs) has been a driving force behind an ever-growing semiconductor industry. Scaling to smaller and smaller features enables increased densities of functional units on the limited real estate of semiconductor devices. The drive to scale-down features in ICs such as microelectronic packages, while optimizing the performance of each device, however is not without issue.

One main issue involves the thermal management of such packages. For example, thermal management of microelectronic packages is becoming extremely important as the power requirements and the number of dies of the microelectronic packages steadily increase. These microelectronic packages typically include stacked dies which includes high power and high density bottom dies. Typically, the performance of these microelectronic packages is limited by the hotspots of the edges of the bottom dies. This leads to other issues as the high power density of the bottom die edges are covered with low thermal conductivity mold materials.

As such, existing packaging solutions may implement high thermal conductivity mold materials over the bottom die edges, attempt to increase the performance of the system cooling solutions, or reduce the thicknesses of the top dies and/or the mold layers. Such existing packaging solutions, however, may substantially increase packaging costs, time, and uncertainty such as leading to other unexpected issues. Furthermore, reducing the top die thicknesses may slightly reduce the hotspot temperature, but the reduction of the top die thickness does not remove (or mitigate) the actual hotspots generated by the edges of the bottom dies.

BRIEF DESCRIPTION OF THE DRAWINGS

Embodiments described herein illustrated by way of example and not limitation in the figures of the accompanying drawings, in which like references indicate similar features. Furthermore, some conventional details have been omitted so as not to obscure from the inventive concepts described herein.

DETAILED DESCRIPTION

Figure 1A:
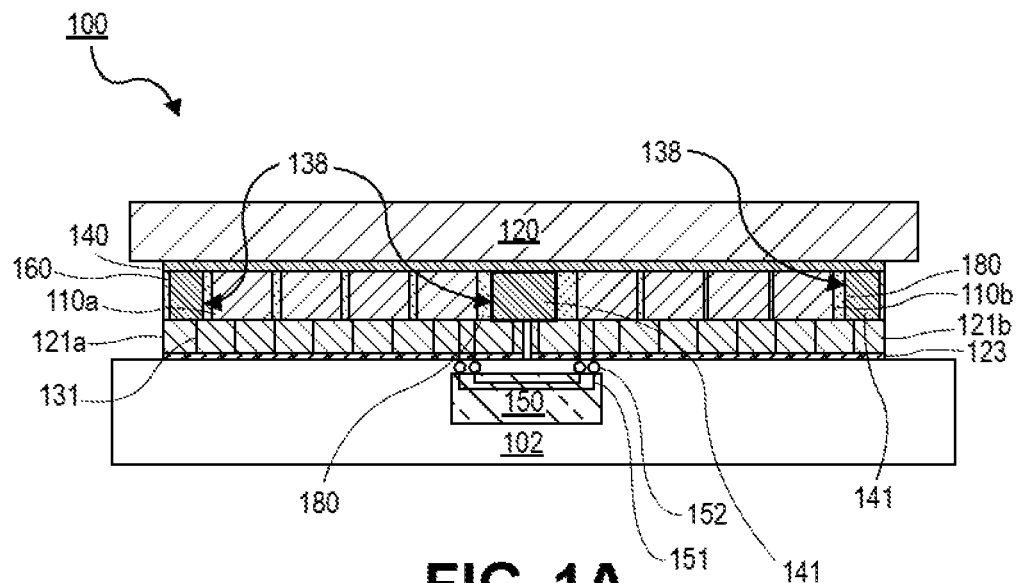
FIG. 1A is an illustration of a cross-sectional view of a semiconductor package with an integrated heat spreader (IHS), a plurality of top dies, a plurality of bottom dies, a thermal interface material (TIM), a pedestal, and a package substrate, according to one embodiment.

Described herein are semiconductor packages with pedestals and methods of forming such semiconductor packages. The semiconductor packages described below and methods of forming such semiconductor packages may include an integrated heat spreader (IHS), a thermal interface material (TIM), an encapsulation layer, a plurality of top dies, a plurality of bottom dies, a pedestal with one or more posts (or legs), and a package substrate. Accordingly, in the embodiments described below, the post(s) of the pedestal may be positioned directly on the one or more regions of the top surfaces of the bottom dies, where the post(s) of the pedestal may surround (or be positioned adjacent to) the top dies, and the one or more regions may include a periphery region of the top surface of the first bottom die and the top surface of the second bottom die. The post(s) of the pedestal may be comprised of a high thermal conductivity material such as a solder TIM (STIM) (or the like), a polymer TIM (PTIM), a liquid conductive material (e.g., a liquid metallic material having a high thermal conductivity), and so on.

In these embodiments, the semiconductor package may drill/laser a plurality of trenches into the encapsulation layer that surrounds (or embeds) the bottom dies. The trenches may be positioned (or located) over the regions (or the periphery regions) of the top surfaces of the bottom dies. Accordingly, in some embodiments, the trenches may expose the regions (or the periphery regions) of the top surfaces of the bottom dies. In an embodiment, the high thermal conductivity material may be subsequently disposed into the drilled/lasered trenches and directly over the exposed regions (or the exposed periphery regions) of the top surfaces of the bottom dies to implement (or form) the post(s) of the pedestal. As described herein, a "pedestal" may refer to (i) a single, monolithic component comprised of a highly thermal conductive material (e.g., as shown with the pedestal 160 of FIG. 1B), and/or (ii) a plurality of posts comprised of the highly thermal conductive material that are discretely positioned as to implement (or form) the pedestal (e.g., as shown with the pedestal 360 of FIG. 3). Note that, according to one embodiment, the pedestal may be comprised of posts that are not discretely positioned and instead are continuously merged (or combined) to form the single, monolithic pedestal.

In some embodiments, as shown below, the pedestal may have a portion (or one or more portions) disposed (or positioned) between the first and second bottom dies, where the pedestal may have a post (or posts) disposed (or positioned) directly on a region (or a portion) of the top surfaces of the first and second bottom dies. Note that, as shown below, the pedestal (or the posts of the pedestal) may be (i) disposed on any portion of the top surface of the first bottom die, and/or (ii) disposed on any portion of the top surface of the second bottom die if needed and/or based on the desired packaging design/application. For example, as shown below with the pedestals in FIGS. 1A-2A-2C, 3A-3D, 4A-4C, 5A-5B, and 6, the pedestal may be positioned (in one or more of these listed positions/locations): (i) between the first and second bottom dies (i.e., the pedestal may have a portion that is between and thus bridges the regions of the top surfaces of the bottom dies), (ii) between one first/second top die and another first/second top die, (iii) on one or more desired regions of the top surface of the first/second bottom die, where the desired regions may be on a periphery region of the top surface of the first/second bottom die, on a centered region of the top surface of the first/second bottom die, on a corner region of the top surface of the first/second bottom die, etc., and/or (iv) adjacent to one or more of the stack of bottom and top dies (or other components) of the semiconductor package—and so on. That is, as shown in these embodiments, the post(s) of the pedestals described below may be positioned on (or proximately adjacent to) any desired region of the bottom dies (or top dies, other components, etc.) of the semiconductor packages, and are thus not limited to a specific region of the top surfaces of the bottom dies of the semiconductor packages.

The embodiments described herein provide improvements to existing packaging solutions by substantially increasing the thermal design power (TDP) capabilities of the semiconductor packages described herein. Additionally, these embodiments also enable removing the hotspots generated by the high power and high density bottom dies, which thereby allows the overall temperature of the semiconductor package to be significantly reduced without needing to reduce the thickness (or z-height) of the top dies. The embodiments described herein also improve the packaging solutions by implementing the pedestal with the one or more post(s) with a single drilling process (or the like) at no additional costs, where the trenches may be automatically filled with the high thermal conductivity materials during the TIM dispensing process. Accordingly, in these embodiments, the thermal resistance from the top periphery regions (or the periphery regions of the top surfaces) of the bottom dies to the IHS is significantly reduced due to the high thermal conductivity of the posts.

The technologies described herein may be implemented in one or more electronic devices. Non-limiting examples of electronic devices that may utilize the technologies described herein include any kind of mobile device and/or stationary device, such as microelectromechanical systems (MEMS) based electrical systems, gyroscopes, advanced driving assistance systems (ADAS), 5G communication systems, cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments, the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices, including semiconductor packages with IHSs, top dies, bottom dies, pedestals with posts, and package substrates with embedded bridge dies.

In the following description, various aspects of the illustrative implementations will be described using terms commonly employed by those skilled in the art to convey the substance of their work to others skilled in the art. However, it will be apparent to those skilled in the art that the present embodiments may be practiced with only some of the described aspects. For purposes of explanation, specific numbers, materials and configurations are set forth in order to provide a thorough understanding of the illustrative implementations. However, it will be apparent to one skilled in the art that the present embodiments may be practiced without the specific details. In other instances, well-known features are omitted or simplified in order not to obscure the illustrative implementations.

Various operations will be described as multiple discrete operations, in turn, in a manner that is most helpful in understanding the present embodiments, however, the order of description should not be construed to imply that these operations are necessarily order dependent. In particular, these operations need not be performed in the order of presentation.

As used herein the terms "top," "bottom," "upper," "lower," "lowermost," and "uppermost" when used in relationship to one or more elements are intended to convey a relative rather than absolute physical configuration. Thus, an element described as an "uppermost element" or a "top element" in a device may instead form the "lowermost element" or "bottom element" in the device when the device is inverted. Similarly, an element described as the "lowermost element" or "bottom element" in the device may instead form the "uppermost element" or "top element" in the device when the device is inverted.

Referring now to FIG. 1A, a cross-sectional illustration of a semiconductor package 100 is shown, in accordance with an embodiment. For some embodiments, the semiconductor package 100 may include an IHS 120, a plurality of top dies 110a-b, a plurality of bottom dies 121a-b, a TIM 140, a pedestal 160, an encapsulation layer 180, and a package substrate 102, according to one embodiment. In one embodiment, the bottom dies 121a-b (or first dies) may be disposed and coupled onto the top surface of the package substrate 102 with an adhesive layer 123 (or the like). For one embodiment, the top dies 110a-b (or the second dies) may be respectively disposed and coupled onto the bottom dies 121a-b.

In some embodiments, the bottom dies 121a-b may include a plurality of interconnects 131 that couple the package substrate 102 to the respective top dies 110a-b. In these embodiments, the interconnects 131 may be through silicon vias (TSVs), through glass vias (TGVs), and/or the like. In some embodiments, as described above, the semiconductor package 100 may include a plurality of trenches 138 (or cavities) disposed into the encapsulation layer 180 and surrounding the pedestal 160, where the pedestal 160 may include one or more posts 141. In an embodiment, the posts 141 may be positioned directly on the periphery regions of the top surfaces of the bottom dies 121a-b. Likewise, in these embodiments, the posts 141 may be positioned adjacent to the top dies 110a-b and separated by the encapsulation layer 180.

In particular, as shown in FIG. 1A, the posts 141 may be positioned directly on the periphery regions of the top surfaces of the bottom dies 121a-b to remove the formation of hotspots on these top surface periphery regions of the bottom dies 121a-b. For some embodiments, the posts 141 may be directly and thermally coupled to the top periphery regions of the bottom dies 121a-b, the TIM 140, and the IHS 120. In an embodiment, the IHS 120 may be disposed over the top dies 110a-b, where the IHS 120 may be coupled to the top dies 110a-b with the TIM 140. For one embodiment, the IHS 120 may be a heatsink or the like, where the heatsink may be a single shared heatsink or two separated heatsinks.

In an embodiment, a bridge 150 may be disposed in the package substrate 102, and the bridge 150 may communicatively couple the bottom die 121a to the bottom die 121b. In an embodiment, the bridge 150 may comprise electrical routings 151-152 (or interconnect structures) that may communicatively couple the bottom die 121a to the bottom die 121b. In an embodiment, the bridge 150 may be a silicon bridge, a glass bridge, or a bridge made of any other substrate material that is suitable for forming bridges. In some embodiments, the bridge 150 may be referred to as an embedded multi-die interconnect bridge (EMIB). For additional embodiments, the bridge 150 may include TSVs 151 (or the like) that may be used to communicatively couple the bottom dies 121a-b.

For one embodiment, the encapsulation layer 180 may be disposed over the bottom dies 121a-b, where the encapsulation layer 180 also surrounds the top dies 110a-b and the posts 141 of the pedestal 160. Additionally, as shown in FIG. 1A, the encapsulation layer 180 may be disposed in between the top dies 110a-b, where the encapsulation layer 180 may be disposed between the top surfaces of the bottom dies 121a-b and the bottom surface of the TIM 140. For one embodiment, the encapsulation layer 180 may be planarized as the top surface of the encapsulation layer 180 may be substantially coplanar to the top surfaces of the top dies 110a-b.

Note that, according to some embodiment, the semiconductor package 100 is merely one example of an embodiment of a semiconductor packaged system. That is, the semiconductor package 100 is not limited to the illustrated semiconductor packaged system, and thus may be designed/formed with fewer, alternate, or additional packaging components and/or with different interconnecting structures. For example, while one IHS 120, two bottom dies 121a-b, two sets of top dies 110a-b, one pedestal 160, and one package substrate 102 with one bridge 150 are illustrated, it is to be appreciated that the semiconductor package 100 may include any number of IHSs 120, bottom dies 121a-b, sets of top dies 110a-b, pedestals 160, and package substrates 102 with bridges 150.

For one embodiment, the semiconductor package 100 may include a ball grid array (BGA) package, a land grid array (LGA) package, and/or a pin grid array (PGA) package. In other embodiments, one or more of the bottom dies 121a-b, the top dies 110a-b, and/or the package substrate 102 may be coupled via solder balls (or the like) that may be implemented as solder bumps/joints formed from respective microbumps. A solder ball (or joint) formed by soldering of a microbump according to an embodiment may itself be referred to as a "bump" and/or a "microbump." Additionally, for other embodiments, one or more of the top dies 110a-b, the bottom dies 121a-b, and the package substrate 102 may be coupled using an anisotropic conductive film (ACF) or the like.

The package substrate 102 may include a variety of electronic structures formed thereon or therein. In certain embodiments, the package substrate 102 may be an organic substrate made up of one or more layers of polymer base materials or ceramic base materials, with conducting regions for transmitting signals. For some embodiments, the package substrate 102 may include, but is not limited to, a package, a substrate, a printed circuit board (PCB), and a motherboard. In one embodiment, the package substrate 102 is a PCB. For one embodiment, the PCB is made of an FR-4 glass epoxy base with thin copper foil laminated on both sides. For certain embodiments, a multilayer PCB can be used, with pre-preg and copper foil used to make additional layers. For example, the multilayer PCB may include one or more dielectric layers, where the dielectric layers may be a photosensitive dielectric layer. For one embodiment, the PCB 102 may also include one or more conductive layers, which may further include copper (or metallic) traces, lines, pads, vias, holes, and/or planes.

For one embodiment, the bottom dies 121a-b and the top dies 110a-b may be comprised, but are not limited to, a semiconductor die, an electronic device (e.g., a wireless device), an integrated circuit (IC), a central processing unit (CPU), a graphic processing unit (GPU), a microprocessor, a platform controller hub (PCH), a memory (e.g., a high bandwidth memory (HBM)), and/or a field-programmable gate array (FPGA). Additionally, in other embodiments, the bottom dies 121a-b may be comprised of one or more materials, including glass, crystal, diamond, low thermal conductive materials, high thermal conductive materials (e.g., gallium nitride (GaN) or the like), silicon, glass-based materials, and/or silicon-based materials (e.g., silicon carbide (SiC) or the like). As described above, in some embodiments, the top dies 110a-b may be a plurality of chiplet dies. While, in another embodiment, the top dies 110a and/or the top dies 110b may be a single monolithic die instead of multiple chiplet dies. The bottom dies 121a-b and the top dies 110a-b may be formed from a material such as silicon and have circuitry thereon that is to be coupled to the package substrate 102 and/or each other. Although some embodiments are not limited in this regard, the package substrate 102 may in turn be coupled to another body, for example, a computer motherboard (or the like).

For one embodiment, the bottom dies 121a may have a thickness that is substantially equal to a thickness of the bottom dies 121b. For one embodiment, the bottom dies 121a-b may have a thickness of approximately 100 um or less. In some embodiments, the top dies 110a may have a thickness that is substantially equal to a thickness of the top dies 110b. For one embodiment, the top dies 110a-b may have a thickness of approximately 200 um to 600 um. In some embodiments, the top dies 110a-b may have a thickness that is substantially equal or different from a thickness of bottom dies 121a-b. For one embodiment, the top dies 110a-b may have a top surface that is substantially coplanar to a top surface of the encapsulation layer 180. Note that, in some embodiments, the thickness of the TIM 140 disposed over the top dies 110a may be substantially equal to or different from the thickness of the TIM 140 that is disposed over the top dies 110b. For one embodiment, the TIM 140 may have a thickness of approximately 25 um to 400 um.

One or more connections between the package substrate 102, the top dies 110a-b, and the bottom dies 121a-b may include one or more interconnect structures and underfill layers if desired. In some embodiments, these interconnect structures (or connections) may variously comprise an alloy of nickel, palladium, and tin (and, in some embodiments, copper). For one embodiment, the underfill layers may be one or more polymer materials that are injected between the respective components. Alternatively, the underfill layers may be molded underfills (MUF) or the like.

In one embodiment, the encapsulation layer 180 may fully surround the outer sidewalls of the top die 110a-b and the posts 141. Note that, in alternate embodiments, the encapsulation layer 180 may be implemented to partially or fully surround the bottom dies 121a-b. In some embodiments the encapsulation layer 180 may include one or more encapsulation materials such as a mold material, an underfill material, a filler material, any similar materials, and/or any combination thereof. Additionally, as described above, the posts 141 may be disposed directly on the top periphery regions of the bottom dies 121a-b, where each of the posts 141 may be directly on one of the bottom dies 121a-b (e.g., as shown with the two posts 141 on the left and right) and/or on both of the bottom dies 121a-b (e.g., as shown with the one post 141 in the middle). As such, in these embodiments, as shown in FIG. 1A, the posts 141 may have the same widths or different widths, where each of the posts 141 may have a width of approximately 0.5 mm to 4 mm.

According to some embodiments, the posts 141 may have the same thicknesses or different thicknesses, where each of the posts 141 may have a width of approximately 0.5 mm to 4 mm. In one embodiment, the posts 141 (or the trenches 138) may have a thickness that is substantially equal to a thickness of the top dies 110a-b. Note that, in some embodiments, the posts 141 may be fully or partially surrounded by the encapsulation layer 180. For some embodiments, the posts 141 may be comprised of the same highly thermal conductive materials implemented for the TIM 140. While, in alternate embodiments as shown in FIG. 1C, the posts 141 may be comprised of one or more highly thermal conductive materials that are different from the highly thermal conductive material(s) of the TIM 140 (i.e., the posts 141 may be comprised of STIM while the TIM 140 may be comprised of PTIM). In one embodiment, the posts 141 may be comprised of a STIM such as an indium STIM or the like. In other embodiments, the posts 141 may be comprised of a metallic TIM, a STIM, a PTIM, and/or any similar highly thermal conductive material(s). Additionally, in some embodiments, the posts 141 (and/or the trenches 138) may have tapered sidewalls, substantially vertical sidewalls, and/or rounded sidewalls.

As described above and shown in the top view of FIG. 1B, in one embodiment, the posts 141 may be merged (or melted/combined) with each other and patterned into a picture frame-shaped pedestal (or the like), where the posts 141 may surround the respective top dies 110a-b, and where at least one of the posts 141 may separate (or be disposed between) the respective top dies 110a-b and/or the bottom dies 121a-b. Note that, in other embodiments, one or more posts 141 may be added (or patterned) in between the sets of top dies 110a-b (e.g., as shown with the posts 541 of FIG. 5A). In some embodiments, the pedestal 160 may be patterned to have one or more different shapes as shown in FIGS. 3A-3D and FIGS. 4A-4C, where the pedestal 160 may have posts 141 with one or more shapes such as rectangular, oval, circular, square, H-shaped, and/or any desired shape.

Furthermore, the TIM 140 may be directly disposed and coupled onto the top surfaces of the top dies 110a-b, the encapsulation layer 180, and/or the posts 141, where the TIM 140 may be positioned between the top surfaces of the top dies 110a-b and the bottom surface of the IHS 120. In one embodiment, the TIM 140 may be a STIM such as an indium STIM or the like. In other embodiments, the TIM 140 may include one or more highly thermal conductivity materials such as a metallic TIM, a STIM, a PTIM, and/or any similar highly thermal conductive material(s).

In one embodiment, the IHS 120 may be disposed over the TIM 140, the top dies 110a-b, the bottom dies 121a-b, and the package substrate 102. The IHS 120 may be manufactured (or shaped) to include a lid and/or a plurality of posts (or posts), where the lid of the IHS 120 may be directly disposed on the top surface of the TIM 140, and the posts of the IHS 120 may be directly disposed on the top surface of the package substrate 102. In some embodiments, the IHS 120 may be a heatsink, a heat spreader, a heat exchanger, a manifold, a cold plate, and/or any similar thermal solution (or device) that may be used to help transfer the heat from the electrical components of the semiconductor package 100 to the ambient environment (or an additional heat spreader). In some embodiments, the IHS 120 may be a shared heatsink disposed over both the top dies 110a-b, or the IHS 120 may be a split heatsink separated into two separate heatsinks individually disposed over the top dies 110a only and the top dies 110b only.

Figure 1B:
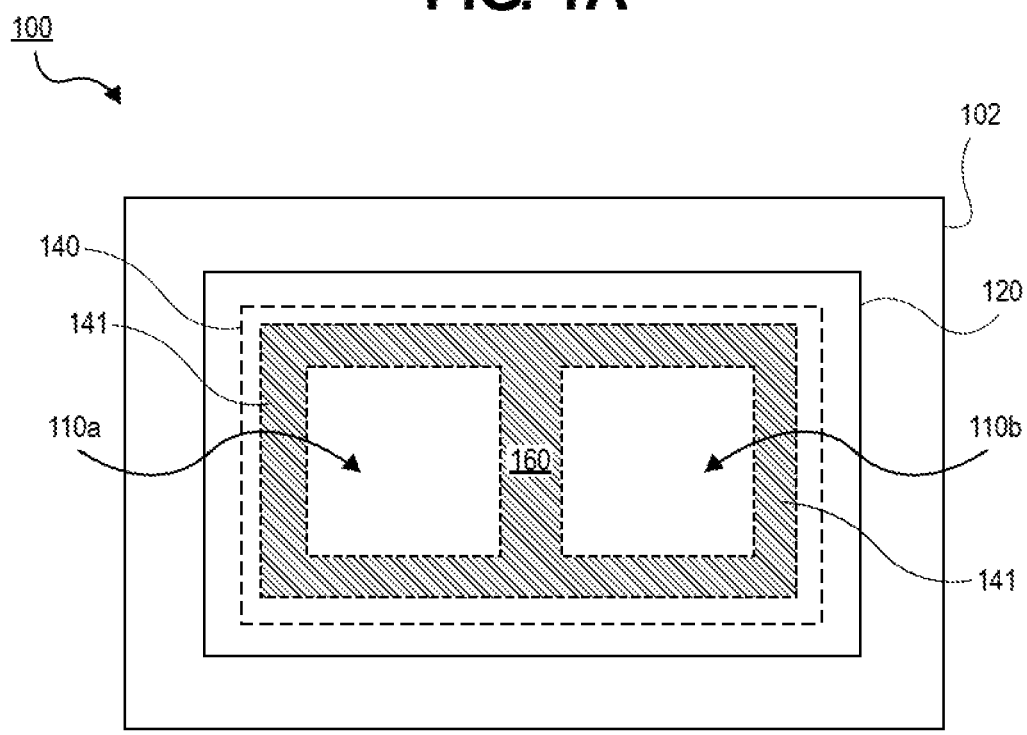
FIG. 1B is an illustration of a plan view of a semiconductor package with an IHS, a plurality of top dies, a TIM, a pedestal, and a package substrate, according to one embodiment.
Figure 1C:
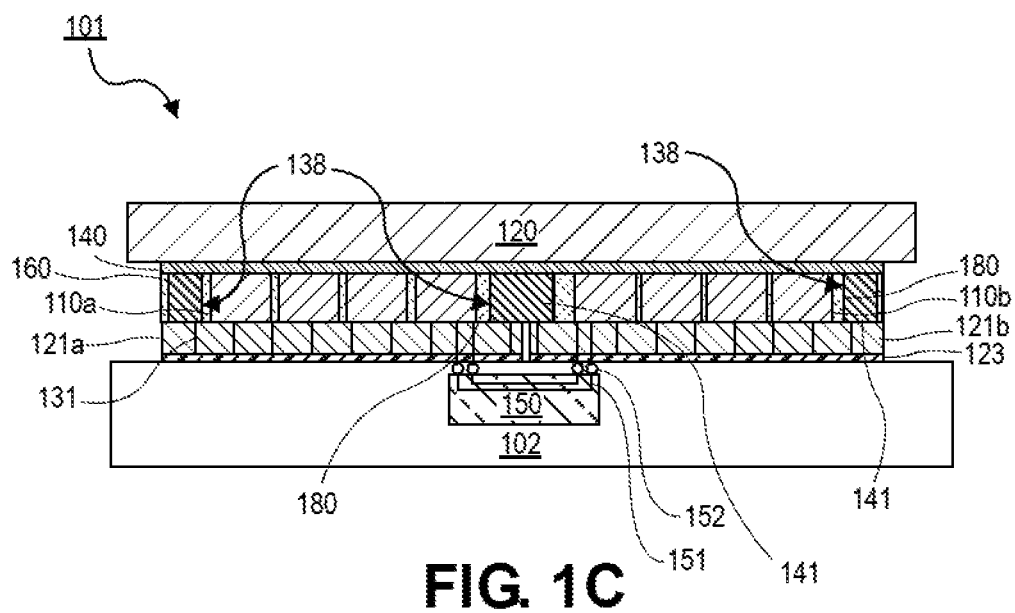
FIG. 1C is an illustration of a cross-sectional view of a semiconductor package with an IHS, a plurality of top dies, a plurality of bottom dies, a TIM, a pedestal, and a package substrate, according to one embodiment.

Note that the semiconductor package 100 of FIGS. 1A-1C may include fewer or additional packaging components based on the desired packaging design.

Figure 2A:
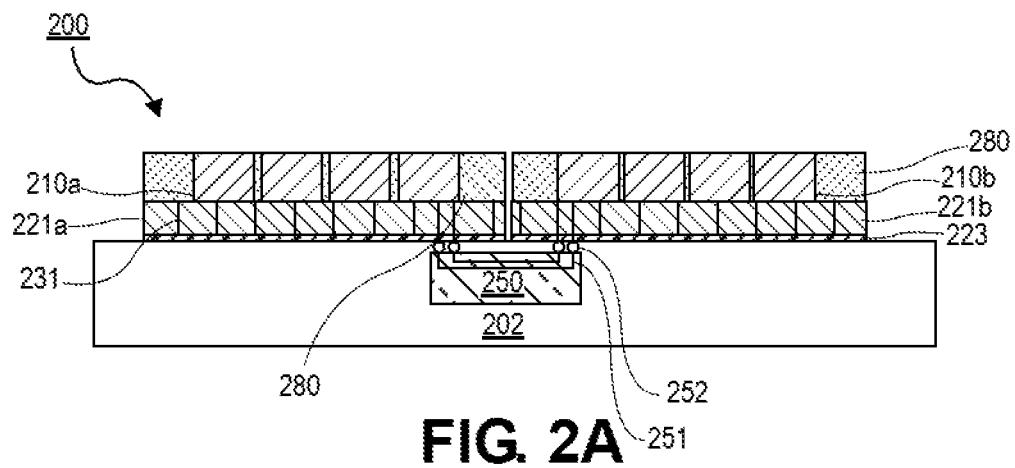
FIGS. 2A-2C are illustrations of cross-sectional views of a semiconductor package with an IHS, a plurality of top dies, a plurality of bottom dies, a TIM, a pedestal, and a package substrate, according to some embodiments.
Figure 2B:
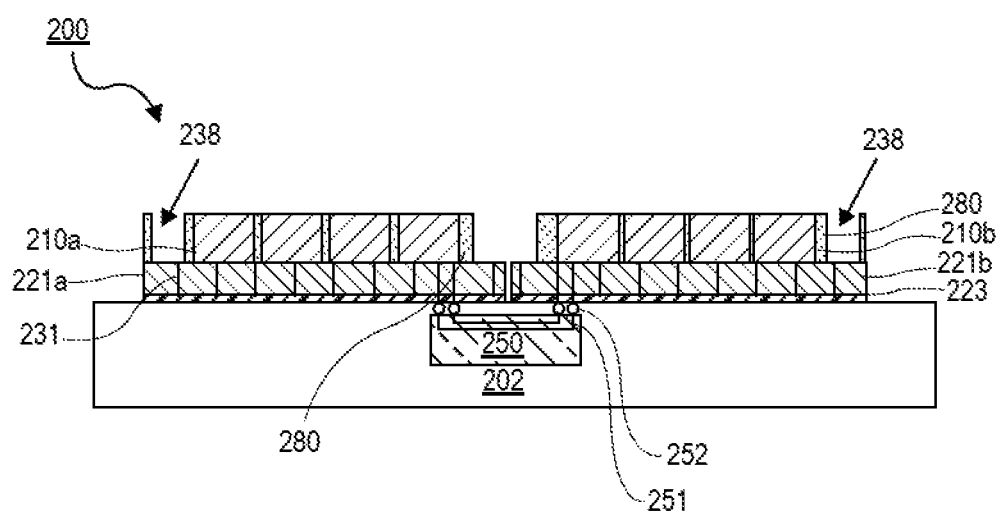
Figure 2C:
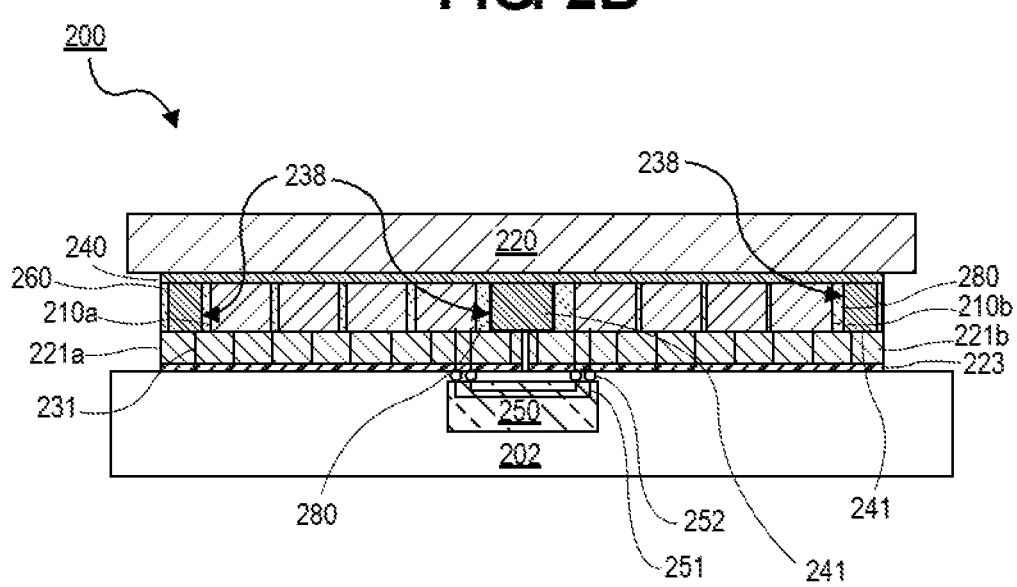

FIGS. 2A-2C are cross-sectional illustrations of a semiconductor package 200, in accordance with some embodiments. For some embodiments, as shown in FIGS. 2A-2C, the semiconductor package 200 may include an IHS 220, a TIM 240, an encapsulation layer 280, a plurality of trenches 238, a pedestal 260, a plurality of posts 241, a plurality of top dies 210a-b, a plurality of bottom dies 221a-b, a plurality of interconnects 231, an adhesive layer 223, a bridge 250, and a package substrate 202. In these embodiments, the semiconductor package 200 of FIGS. 2A-2C with the posts 241 of the pedestal 260 may be substantially similar to the semiconductor package 100 with the posts 141 of the pedestal 160 described above in FIG. 1A.

Likewise, the components of the semiconductor package 200 may be substantially similar to the components of the semiconductor package 100 described above in FIG. 1A. Accordingly, the IHS 220, the TIM 240, the encapsulation layer 280, the trenches 238, the top dies 210a-b, the bottom dies 221a-b, the interconnects 231, the adhesive layer 223, the bridge 250, and the package substrate 202 may be substantially similar to the IHS 120, the TIM 140, the encapsulation layer 180, the trenches 138, the top dies 110a-b, the bottom dies 121a-b, the interconnects 131, the adhesive layer 123, the bridge 150, and the package substrate 102 described above in FIG. 1A.

Referring now to FIG. 2A, a cross-sectional illustration of a semiconductor package 200 is shown, in accordance with an embodiment. For some embodiments, the semiconductor package 200 may include the top dies 210a-b and bottom dies 221a-b respectively stacked on the package substrate 202, where the bottom dies 221a-b may be coupled to the package substrate 202 with the adhesive layer 223. The encapsulation layer 280 may be disposed over the top surface of the bottom dies 221a-b and surrounds the top dies 210a-b, where the encapsulation layer 280 may be particularly disposed on the top periphery regions of the bottom dies 221a-b. In some embodiments, the top surface of the encapsulation layer 280 may be planarized with a polishing/grinding process (or the like) and may thus be substantially coplanar to the top surface of the top dies 210a-b.

Referring now to FIG. 2B, a cross-sectional illustration of a semiconductor package 200 is shown, in accordance with an embodiment. For some embodiments, the semiconductor package 200 may implement the trenches 238 into the encapsulation layer 280, where the trenches 238 may expose the top surface of the bottom dies 221a-b. In an embodiment, the trenches 238 may be implemented with a drilling process, a laser process, or the like, where the drilled/lasered trenches may have tapered sidewalls, substantially vertical sidewalls, and/or rounded sidewalls. As described above, the trenches 238 may provide openings over the top periphery regions of the bottom dies 221a-b.

Referring now to FIG. 2C, a cross-sectional illustration of a semiconductor package 200 is shown, in accordance with an embodiment. For some embodiments, a highly thermal conductive material may be disposed (or deposited) into the trenches 238 with a TIM dispensing process (or the like) to implement (or form) the posts 241 of the pedestal 260 directly on the top periphery regions of the bottom dies 221a-b. In these embodiments, the TIM 240 may then be disposed over the posts 241 of the pedestal 260, the encapsulation layer 280, and the top dies 210a-b.

Alternatively, in other embodiments, the TIM 240 may be disposed over/on the top surfaces of the trenches 238, the encapsulation layer 280, and the top dies 210a-b, where the TIM 240 may then be heated and automatically melt into the trenches 238 to implement the posts 241 of the pedestal 260 within the trenches 238 and directly on the top periphery regions of the bottom dies 221a-b. As described above, in some embodiments, the TIM 240 may be comprised of the same highly thermal conductive materials implemented for the posts 241 of the pedestal 260. While, in other embodiments, the TIM 240 may be comprised of different highly thermal conductive materials different from the posts 241 of the pedestal 260. Lastly, as shown in FIG. 2C, the IHS 220 may be disposed over the TIM 240 and the package substrate 202, where the posts 241 may thus create a low thermal resistance path from the top periphery regions of the bottom dies 221a-b to the top surface of the IHS 220—and thus substantially improve the TDP of the semiconductor package 200.

Note that the semiconductor package 200 of FIGS. 2A-2C may include fewer or additional packaging components based on the desired packaging design.

Referring now to FIGS. 3A-3D, plan illustrations of a plurality of semiconductor packages 300-303 are shown, in accordance with an embodiment. For some embodiments, the semiconductor packages 300-303 may be substantially similar to the semiconductor package 100 described above in FIGS. 1A-1C, with the exception that the pedestal 360 may be patterned (or implemented) with different shapes as shown the top views of the respective semiconductor packages 300-303 in FIGS. 3A-3D. Likewise, the components of the semiconductor packages 300-303 of FIGS. 3A-3D may be substantially similar to the components of the semiconductor package 100 described above in FIGS. 1A-1C. Accordingly, the package substrate 305, the top dies 310a-b, the pedestals 360, the posts 341, the TIM 340, and the IHS 320 may be substantially similar to the package substrate 102, the top dies 110a-b, the pedestals 160, the posts 141, the TIM 140, and the IHS 120 described above in FIGS. 1A-1C.

Whereas the pedestal 160 is implemented (or designed/shaped) as a picture-frame-shaped pedestal, and the posts 141 are patterned (or merged/melted/combined) into a single, monolithic pedestal shown in FIGS. 1A-1C, the pedestals 360 may have one or more different shapes and be patterned with the posts 341 that ultimately implement (or form) the one or more different shapes of the respective pedestals 360 shown in FIGS. 3A-3D.

Figure 3A:
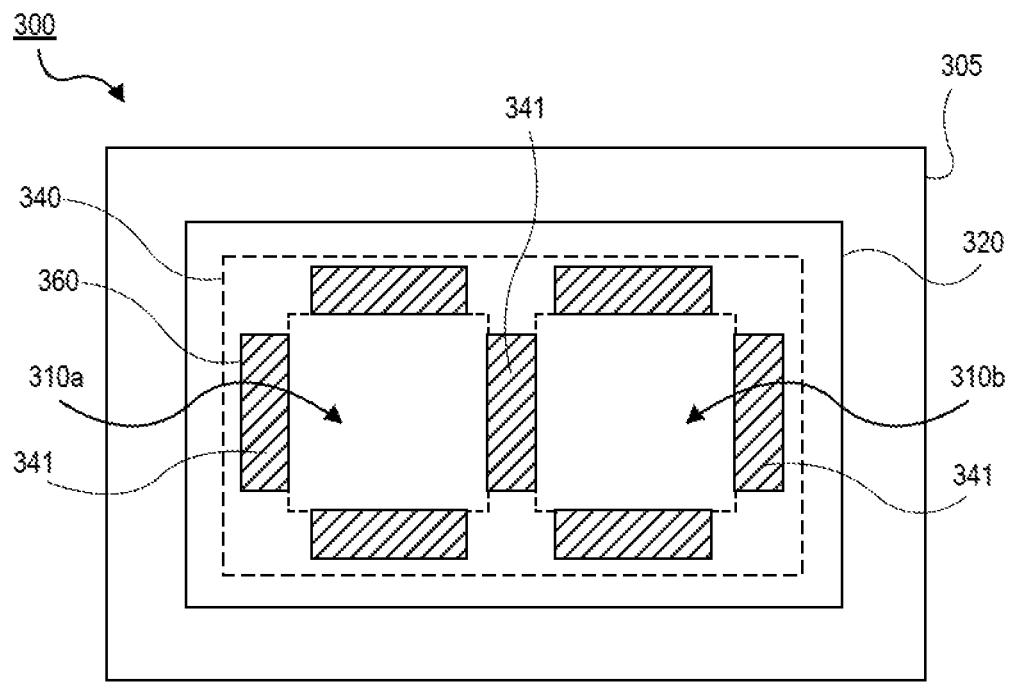
FIGS. 3A-3D are illustrations of plan views of a semiconductor package with an IHS, a plurality of top dies, a plurality of bottom dies, a TIM, a pedestal, and a package substrate, wherein the pedestal includes a plurality of posts, according to some embodiments.

As shown in FIG. 3A, in one embodiment, the pedestal 360 may include the posts 341 patterned into rectangular-shaped posts and having substantially equal surfaces areas. The posts 341 of FIG. 3A may surround and be discretely positioned around (or adjacent to) the respective top dies 310a-b, where each of the posts 341 may be disposed substantially close (or near/adjacent) to one of the outer sidewalls of the respective top dies 310a-b, and where at least one of the posts 341 (i.e., a portion of the pedestal 360) may disposed between the top dies 310a-b (and the bottom dies).

Figure 3B:
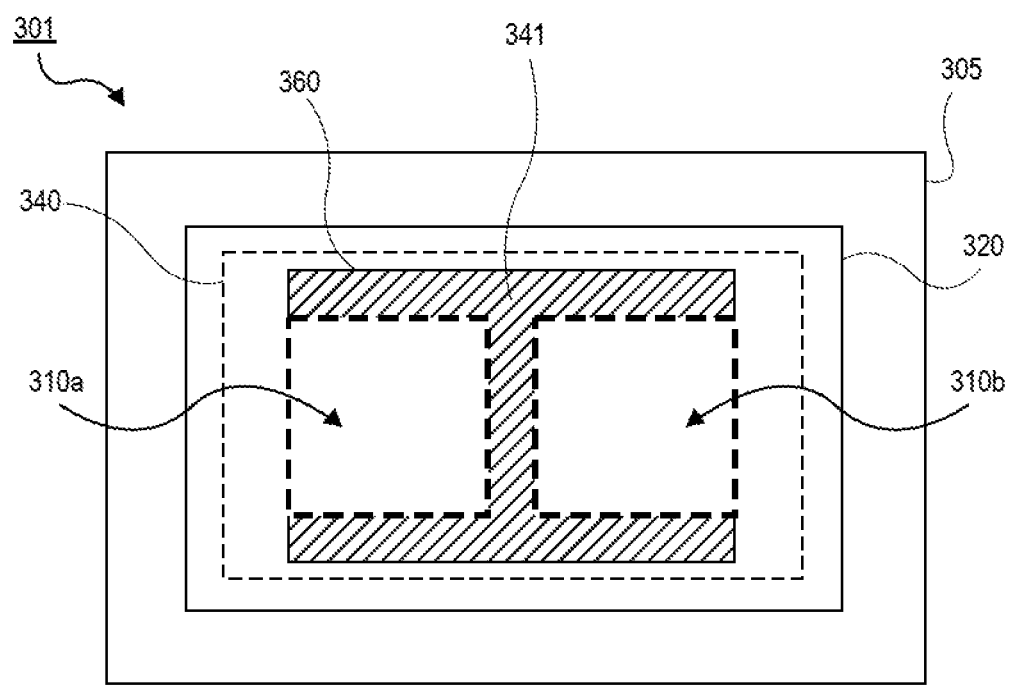

As shown in FIG. 3B, in another embodiment, the pedestal 360 may include the posts 341 merged (or melted/combined) with each other and patterned into an I-shaped pedestal. The pedestal 360 of FIG. 3B includes the posts 341 patterned into rectangular-shaped posts with two of the posts 341 having substantially equal surfaces areas, and one of the posts 341 having a smaller surface area. The posts 341 of FIG. 3B may surround and be discretely positioned around (or adjacent to) the respective top dies 310a-b, where each of the posts 341 may be disposed substantially close (or near/adjacent) to one or more of the outer sidewalls of the respective top dies 310a-b, and where at least one of the posts 341 may be disposed between the top dies 310a-b (and the bottom dies).

Figure 3C:
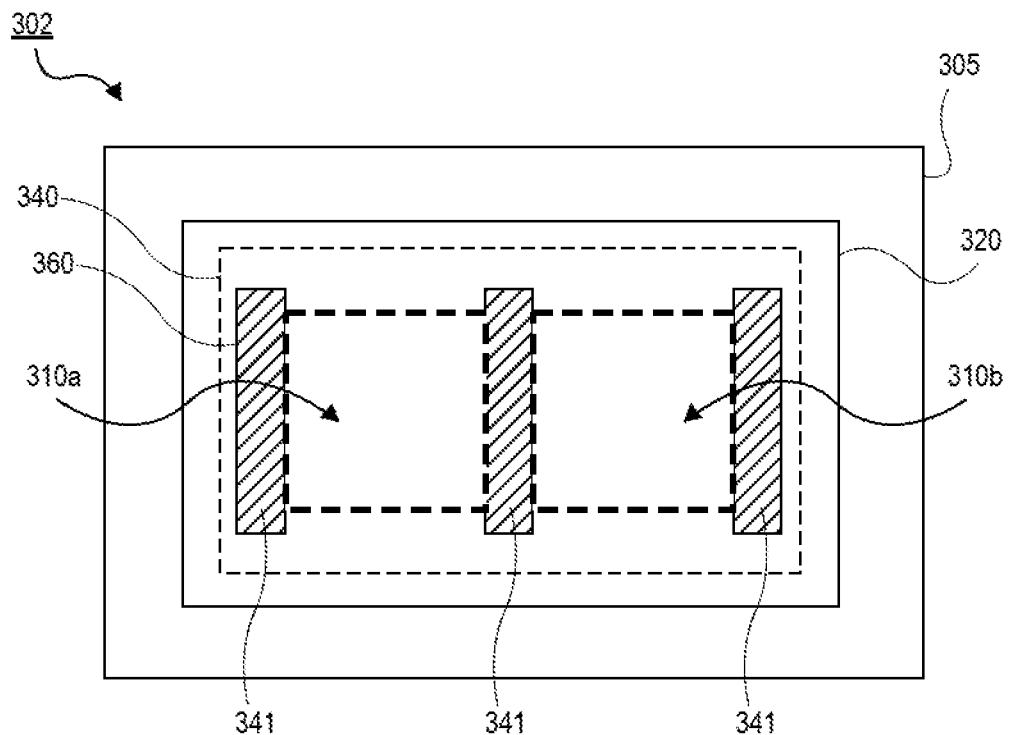

As shown in FIG. 3C, for another embodiment, the pedestal 360 may include the posts 341 patterned into long rectangular-shaped posts and having substantially equal surfaces areas. The posts 341 of FIG. 3C may be disposed substantially parallel to each other and discretely positioned around (or adjacent to) the respective top dies 310a-b, where each of the posts 341 may be disposed substantially close (or near/adjacent) to one of the outer sidewalls of the respective top dies 310a-b, and where at least one of the posts 341 may be disposed between the top dies 310a-b (and the bottom dies).

Figure 3D:
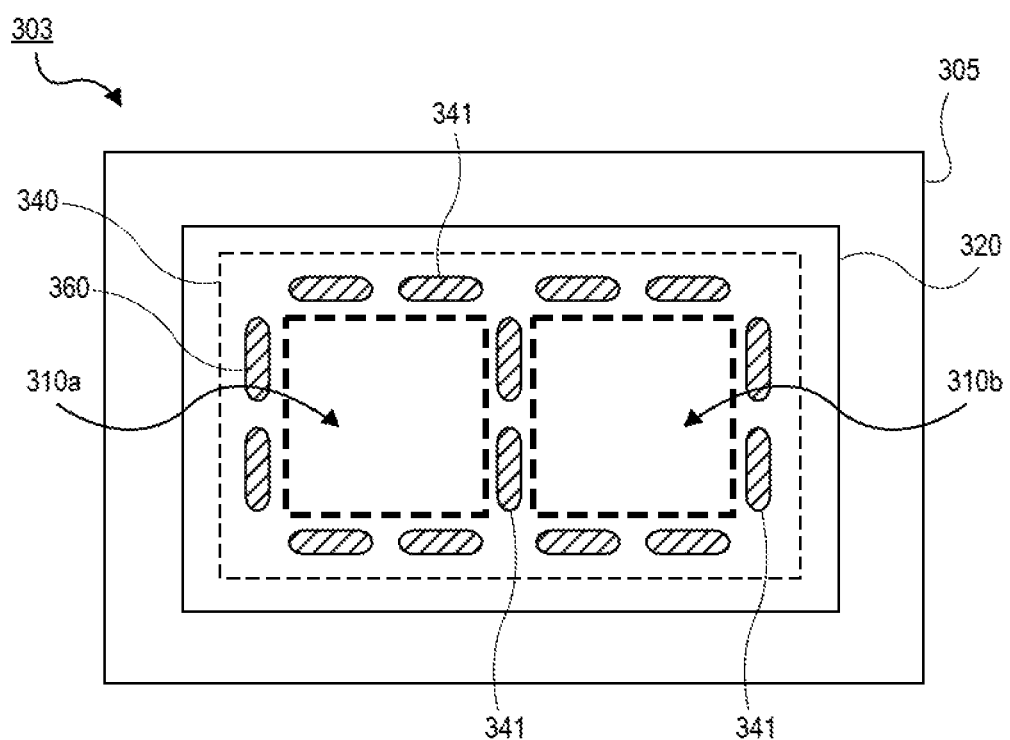

As shown in FIG. 3D, in an additional embodiment, the pedestal 360 may include the posts 341 patterned into small oval-shaped posts and having substantially equal surfaces areas. The posts 341 of FIG. 3D may surround and be discretely positioned around (or adjacent to) the respective top dies 310a-b, where each of the posts 341 may be disposed substantially close (or near/adjacent) to one of the outer sidewalls of the respective top dies 310a-b, and where at least one of the posts 341 may be disposed between the top dies 310a-b (and the bottom dies).

Note that the semiconductor packages 300-303 of FIGS. 3A-3D may include fewer or additional packaging components based on the desired packaging design.

Figure 4A:
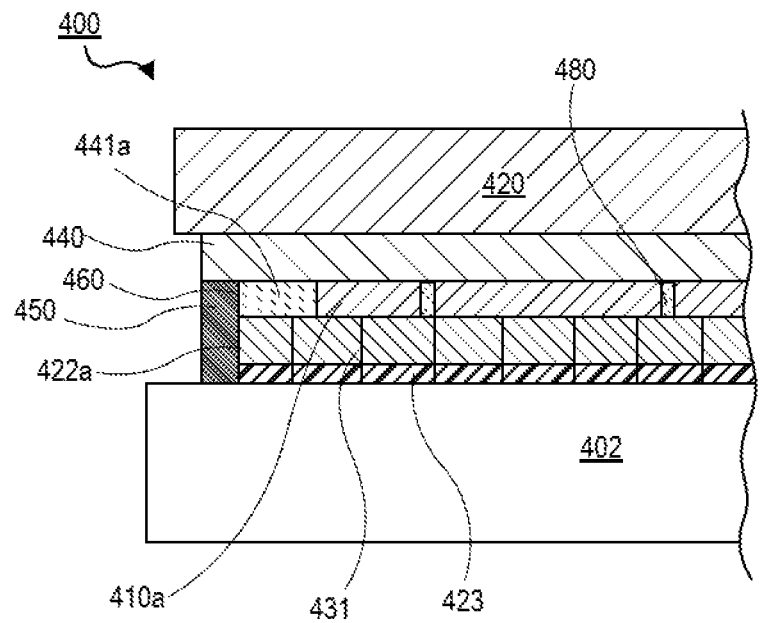
FIGS. 4A-4C are illustrations of cross-sectional views of a portion of a semiconductor package with an IHS, a plurality of top dies, a bottom die, a TIM, a pedestal with a plurality of posts, a plurality of dams, and a package substrate, wherein the plurality of posts of the pedestal are comprised of one or more different shapes, according to some embodiments.
Figure 4B:
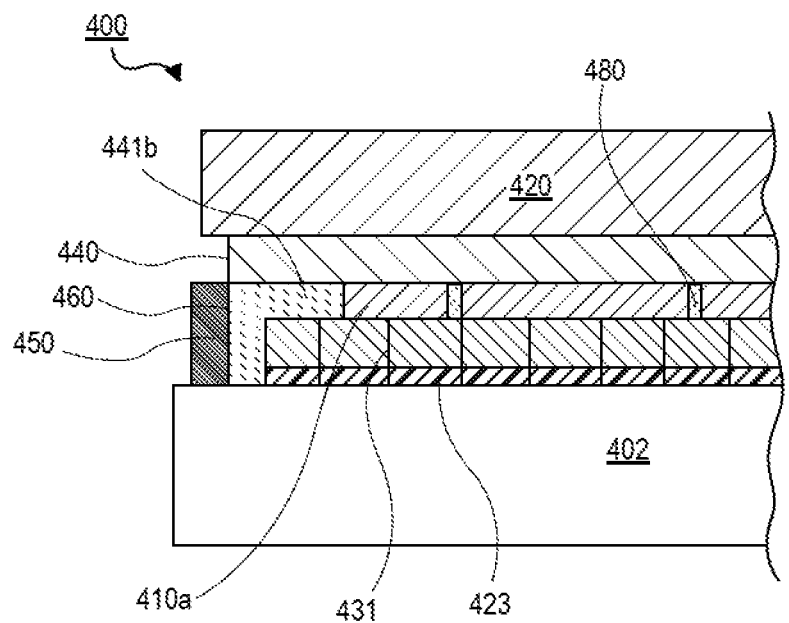
Figure 4C:
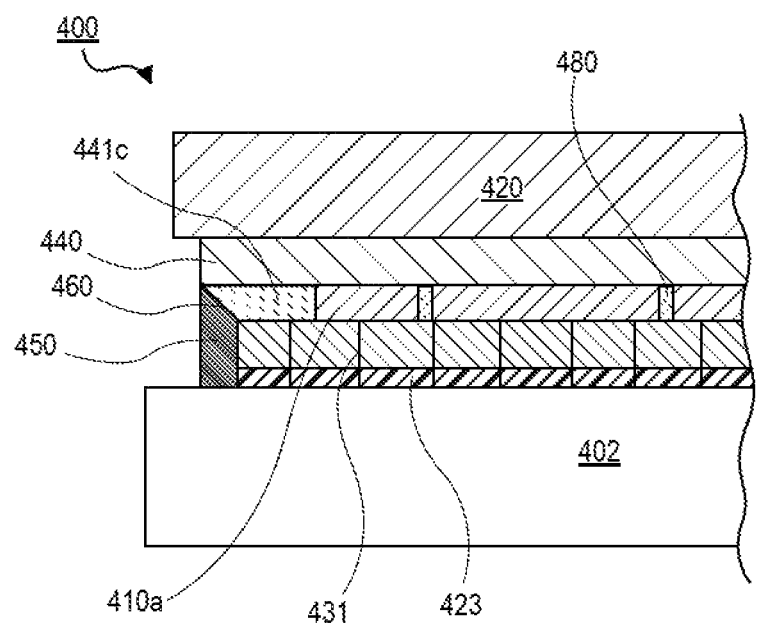

Referring now to FIGS. 4A-4C, cross-sectional illustrations of portions of a plurality of semiconductor package 400 are shown, in accordance with an embodiment. For some embodiments, the semiconductor package 400 may be substantially similar to the semiconductor package 100 described above in FIGS. 1A-1C, with the exception that the posts 441 of the pedestals 460 may be patterned (or implemented) having one or more different shapes such as rectangular-shaped posts, L-shaped posts, and/or trapezoid-shaped posts, and that the dams 450 may be directly coupled to the posts 441 of the pedestal 460 and the package substrate 402 as shown in FIGS. 4A-4C. Likewise, the components of the semiconductor package 400 of FIGS. 4A-4C may be substantially similar to the components of the semiconductor package 100 described above in FIGS. 1A-1C. Accordingly, the package substrate 402, the adhesive layer 423, the bottom die 421a with the interconnects 431, the top dies 410a, the encapsulation layer 480, the pedestal 460, the posts 441, the TIM 440, and the IHS 420 may be substantially similar to the package substrate 102, the adhesive layer 123, the bottom die 121a with the interconnects 131, the top dies 110a, the encapsulation layer 180, the pedestal 160, the posts 141, the TIM 140, and the IHS 120 described above in FIGS. 1A-1C.

Whereas the posts 141 are patterned (or merged/melted/combined) into rectangular-shaped posts shown in FIGS. 1A-1C, the posts 441 of the pedestals 460 of FIGS. 4A-4D may have one or more different shapes and be supported (or aided/enhanced) by the dams 450 having one or more different shapes based on the different shapes of the pedestals 460. Note that, in some embodiments, the encapsulation layer 480 may not be disposed between the posts 441 and the respective top dies 410a. However, in alternate embodiments, the encapsulation layer 480 may be included (or added/disposed) between and/or to surround the posts 441 and the respective top dies 410a.

As shown in FIG. 4A, in one embodiment, the pedestal 460 may include the posts 441 patterned into one or more rectangular-shaped posts. The posts 441 of FIG. 4A may be disposed directly on the periphery region (and/or the edges) of the top surface of the bottom die 421a, where the posts 441 are directly surrounded by the dam 450 and the respective top dies 410a. The dam 450 of FIG. 4A may have a thickness substantially equal to a combined thickness of the stack of bottom die 421a and top dies 410a (i.e., the dam 450 may have a top surface substantially coplanar to the top surfaces of the top dies 410a), where one of the outer sidewalls of the dam 450 may be directly coupled to one of the outer sidewalls of the bottom die 421a and the posts 441. The posts 441 of FIG. 4A may be directly positioned adjacent to the respective top dies 410a, where one of the outer sidewalls of the posts 441 may be directly coupled to one of the outer sidewalls of the respective top dies 410a.

As shown in FIG. 4B, in another embodiment, the pedestal 460 may include the posts 441 patterned into one or more L-shaped posts. The posts 441 of FIG. 4B may be disposed directly on the periphery region (and/or the edges) of the top surface of the bottom die 421a, where the posts 441 are directly surrounded by the dam 450 and the respective top dies 410a. The dam 450 of FIG. 4B may have a thickness substantially equal to a combined thickness of the stack of bottom die 421a and top dies 410a (i.e., the dam 450 may have a thickness substantially equal to a thickness of the posts 441), where one of the outer sidewalls of the dam 450 may be directly coupled to one of the outer sidewalls of the posts 441. The posts 441 of FIG. 4B may be directly positioned adjacent to both the bottom die 421a and the respective top dies 410a, where one of the outer sidewalls of the posts 441 may be directly coupled to one of the outer sidewalls of the bottom die 421a, and another of the outer sidewalls of the posts 441 may be directly coupled to one of the outer sidewalls of the respective top dies 410a.

As shown in FIG. 4C, in one embodiment, the pedestal 460 may include the posts 441 patterned into one or more trapezoidal-shaped posts. The posts 441 of FIG. 4C may be disposed directly on the periphery region (and/or the edges) of the top surface of the bottom die 421a, where the posts 441 are directly surrounded by the dam 450 and the respective top dies 410a. The dam 450 of FIG. 4C may have a total thickness substantially equal to a combined thickness of the stack of bottom die 421a and top dies 410a, where one of the outer sidewalls of the dam 450 may be slanted (or tapered) and directly coupled to one of the outer sidewalls of the bottom die 421a and the posts 441. The posts 441 of FIG. 4C may be directly positioned adjacent to the respective top dies 410a, where one of the outer sidewalls of the posts 441 may be directly coupled to one of the outer sidewalls of the respective top dies 410a.

Note that the semiconductor package 400 of FIGS. 4A-4C may include fewer or additional packaging components based on the desired packaging design.

Figure 5A:
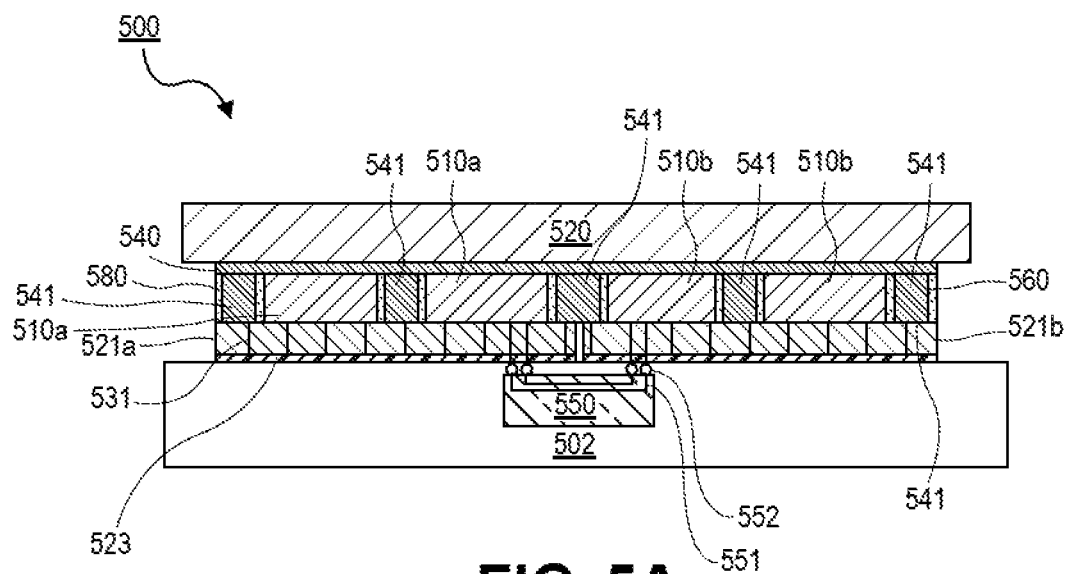
FIG. 5A is an illustration of a cross-sectional view of a semiconductor package with an IHS, a plurality of top dies, a plurality of bottom dies, a TIM, a pedestal, and a package substrate, according to one embodiment.
Figure 5B:
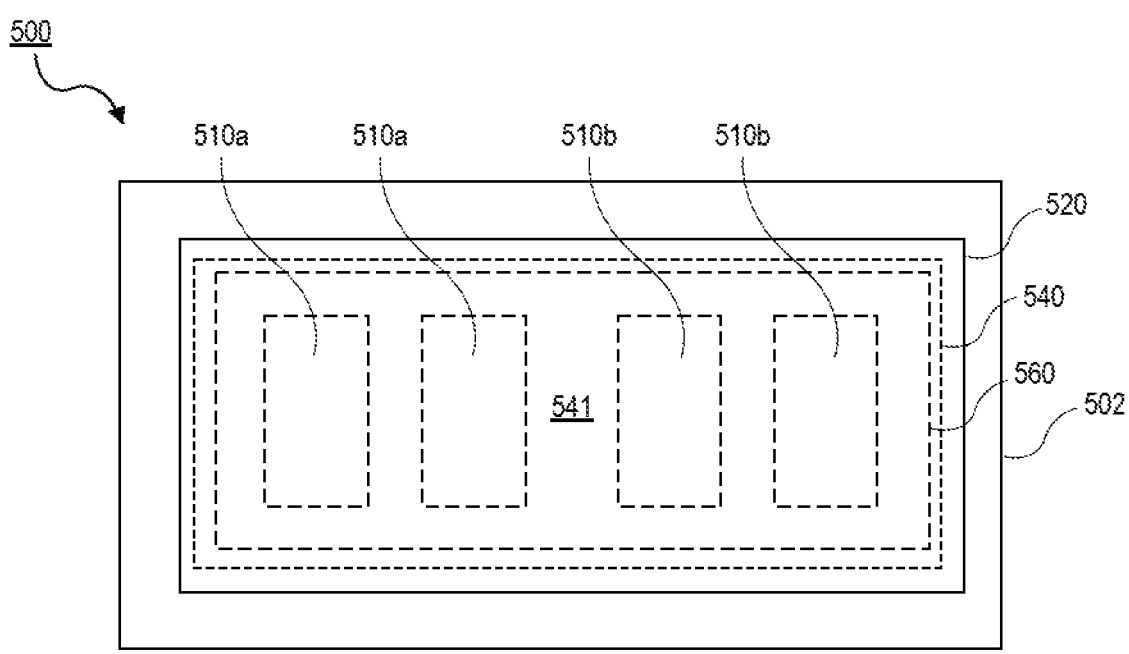
FIG. 5B is an illustration of a plan view of a semiconductor package with an IHS, a plurality of top dies, a plurality of bottom dies, a TIM, a pedestal, and a package substrate, according to one embodiment.

Referring now to FIGS. 5A-5B, a cross-sectional illustration and a respective plan illustration of a semiconductor package 500 are shown, in accordance with an embodiment. For some embodiments, the semiconductor package 500 may be substantially similar to the semiconductor package 100 described above in FIGS. 1A-1C, with the exception that the pedestal 560 may have one or more posts 541 positioned between the respective top dies 510a-b as shown in FIGS. 5A-5B. Likewise, the components of the semiconductor package 500 of FIGS. 5A-5B may be substantially similar to the components of the semiconductor package 100 described above in FIGS. 1A-1C. Accordingly, the package substrate 502, the bridge 550 with the electrical routings 551-552, the adhesive layer 523, the bottom dies 521a-b with the interconnects 531, the top dies 510a-b, the encapsulation layer 580, the pedestal 560, the posts 541, the TIM 540, and the IHS 520 may be substantially similar to the package substrate 102, the bridge 150 with the electrical routings 151-152, the adhesive layer 123, the bottom dies 121a-b with the interconnects 131, the top dies 110a-b, the encapsulation layer 180, the pedestal 160, the posts 141, the TIM 140, and the IHS 120 described above in FIGS. 1A-1C.

Whereas the posts 141 of the pedestal 160 are positioned on the periphery regions of the top surfaces of the bottom dies 121a-b shown in FIGS. 1A-1C, the posts 541 of the pedestals 560 of FIGS. 5A-5B are positioned on the periphery regions of the top surfaces of the bottom dies 521a-b, and also positioned in between each of the respective sets of top dies 510a-b. That is, in an embodiment, one or more of the posts 541 may be disposed on the top surfaces of the respective bottom dies 521a-b, where such posts 541 may not be positioned on the periphery regions of the top surfaces of the respective bottom dies 521a-b.

Note that the semiconductor package 500 of FIGS. 5A-5B may include fewer or additional packaging components based on the desired packaging design.

Figure 6:
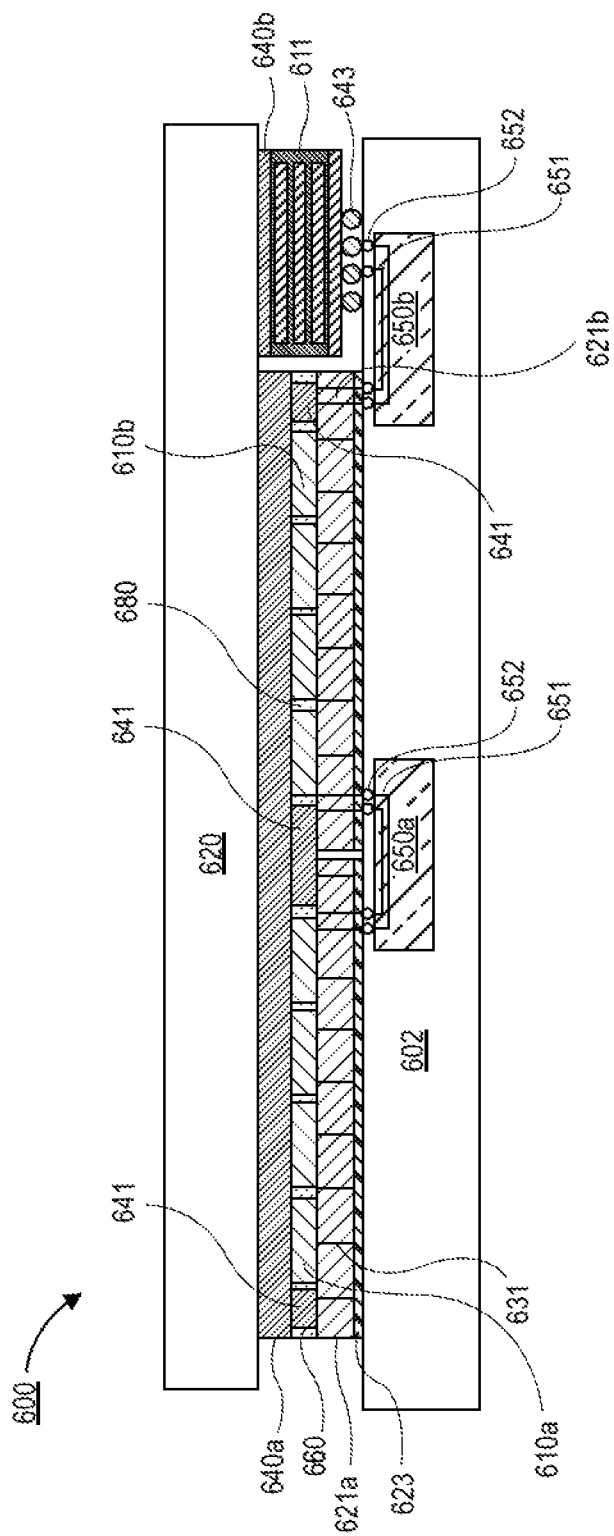
FIG. 6 is an illustration of a cross-sectional view of a semiconductor package with an IHS, a plurality of top dies, a plurality of bottom dies, a die, a TIM, a pedestal, and a package substrate, according to one embodiment.

Referring now to FIG. 6, a cross-sectional illustration of a semiconductor package 600 is shown, in accordance with an embodiment. For some embodiments, the semiconductor package 600 may be substantially similar to the semiconductor package 100 described above in FIGS. 1A-1C, with the exception that the die 611 (e.g., a die, a stack of dies, a stack of HBM dies, etc.) may be disposed and coupled directly on the package substrate 602 with the solder balls 643, that the die 611 may be positioned adjacent to the pedestal 660, the TIM 640a, and the bottom die 621b, that the TIMs 640a-b are implemented separately and respectively to cover the stack of bottom dies 621a-b and top dies 610*a-b* and the die 611, that only one of the TIMs 640*a* is coupled to the pedestal 660, and that the TIM 640*a* (and the stack of TIM 640*a* and the pedestal 660) may have a thickness different from a thickness of the TIM 640*b*.

Likewise, the components of the semiconductor package 600 may be substantially similar to the components of the semiconductor package 100 described above in FIGS. 1A-1C. Accordingly, the package substrate 602, the bridges 650*a-b* with the electrical routings 651-652, the adhesive layer 623, the bottom dies 621*a-b* with the interconnects 631, the top dies 610*a-b*, the encapsulation layer 680, the pedestal 660, the posts 641, the TIMs 640*a-b*, and the IHS 620 may be substantially similar to the package substrate 102, the bridge 150 with the electrical routings 151-152, the adhesive layer 123, the bottom dies 121*a-b* with the interconnects 131, the top dies 110*a-b*, the encapsulation layer 180, the pedestal 160, the posts 141, the TIM 140, and the IHS 120 described above in FIGS. 1A-1C.

Note that the semiconductor package 600 may include fewer or additional packaging components based on the desired packaging design.

Figure 7:
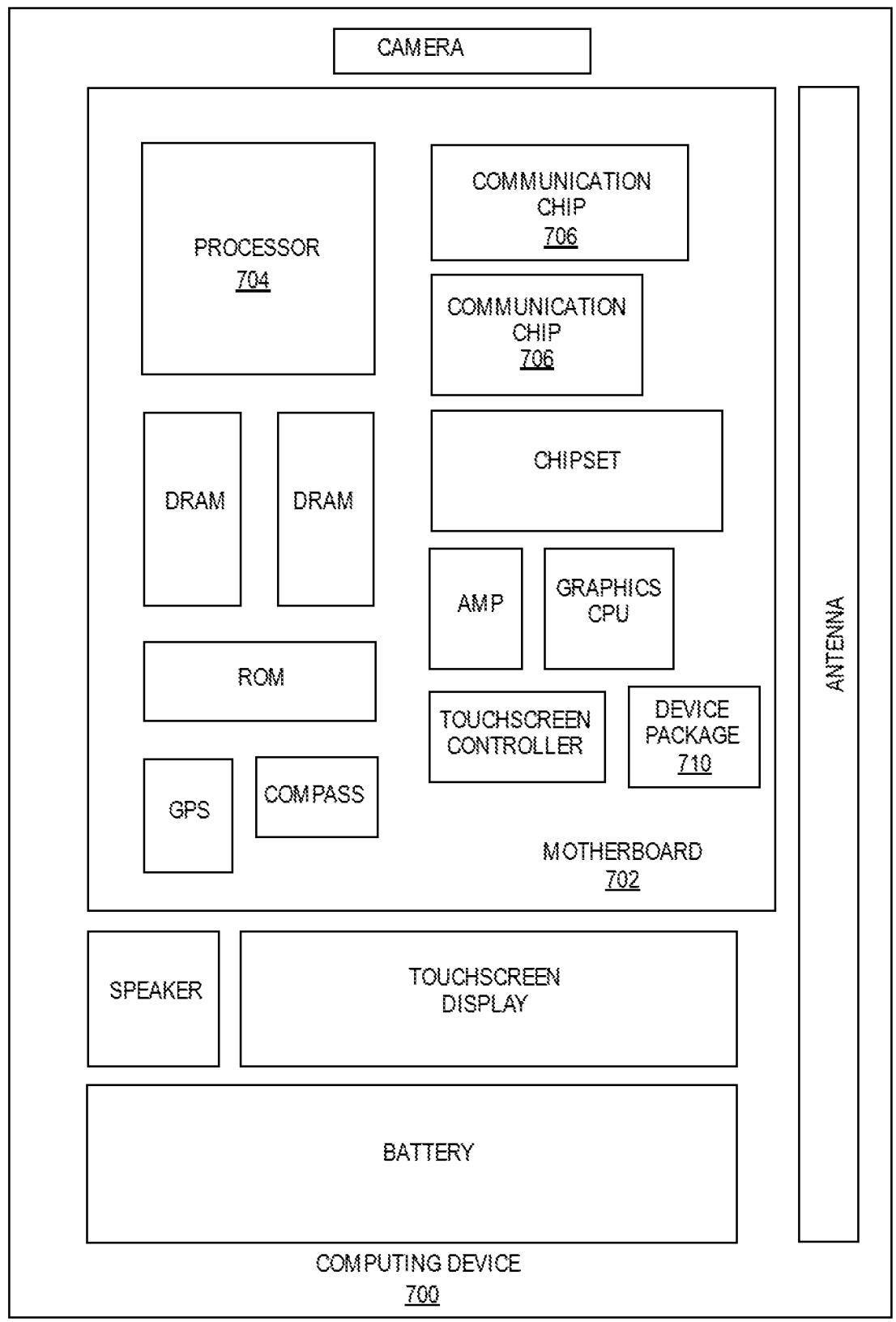
FIG. 7 is an illustration of a schematic block diagram illustrating a computer system that utilizes a semiconductor package with an IHS, a plurality of top dies, a plurality of bottom dies, a TIM, a pedestal, and a package substrate, according to one embodiment.

FIG. 7 is an illustration of a schematic block diagram illustrating a computer system 700 that utilizes a device package 710 (or a semiconductor package) with an IHS, a TIM, a plurality of top and bottom dies, a pedestal comprised of one or more posts, an encapsulation layer, and a package substrate, according to one embodiment. FIG. 7 illustrates an example of computing device 700. Computing device 700 houses a motherboard 702. Motherboard 702 may include a number of components, including but not limited to processor 704, device package 710 (or semiconductor package), and at least one communication chip 703. Processor 704 is physically and electrically coupled to motherboard 702. For some embodiments, at least one communication chip 706 is also physically and electrically coupled to motherboard 702. For other embodiments, at least one communication chip 706 is part of processor 704.

Depending on its applications, computing device 700 may include other components that may or may not be physically and electrically coupled to motherboard 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

At least one communication chip 706 enables wireless communications for the transfer of data to and from computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. At least one communication chip 706 may implement any of a number of wireless standards or protocols, including but not limited to Wi-Fi (IEEE 802.11 family), WiMAX (IEEE 802.112 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

Processor 704 of computing device 700 includes an integrated circuit die packaged within processor 704. Device package 710 may be a semiconductor package that may include, but is not limited to, a substrate, a package substrate, and/or a PCB. In one embodiment, device package 710 may be substantially similar to the semiconductor packages of FIGS. 1A-1C, 2A-2C, 3A-3D, 4A-4C, 5A-5B, and 6 described herein. Device package 710 may include the pedestal having the posts directly positioned on the top periphery regions of the bottom dies to remove the generation of hotspots on the top surfaces of the bottom dies as described herein (e.g., as illustrated and described above with the pedestals of FIGS. 1A-1C, 2A-2C, 3A-3D, 4A-4C, 5A-5B, and 6)—or any other components from the figures described herein.

Note that device package 710 may be a single component/device, a subset of components, and/or an entire system, as the materials, features, and components may be limited to device package 710 and/or any other component of the computing device 700 that may need the pedestals and/or the posts as described herein (e.g., the motherboard 702, the processor 704, and/or any other component of the computing device 700 that may need the embodiments of the pedestals, the posts, and/or the semiconductor packages described herein).

For certain embodiments, the integrated circuit die may be packaged with one or more devices on a package substrate that includes a thermally stable RFIC and antenna for use with wireless communications and the device package, as described herein, to reduce the z-height of the computing device. The term "processor" may refer to any device or portion of a device that processes electronic data from registers and/or memory to transform that electronic data into other electronic data that may be stored in registers and/or memory.

At least one communication chip 706 also includes an integrated circuit die packaged within the communication chip 706. For some embodiments, the integrated circuit die of the communication chip 706 may be packaged with one or more devices on a package substrate that includes one or more device packages, as described herein.

In the foregoing specification, embodiments have been described with reference to specific exemplary embodiments thereof. It should be borne in mind, however, that all of these and similar terms are to be associated with the appropriate physical quantities and are merely convenient labels applied to these quantities. It will be evident that various modifications may be made thereto without departing from the broader spirit and scope. The specification and drawings are, accordingly, to be regarded in an illustrative sense rather than a restrictive sense.

The following examples pertain to further embodiments. The various features of the different embodiments may be variously combined with some features included and others excluded to suit a variety of different applications.

The following examples pertain to further embodiments:

Example 1 is a semiconductor package, comprising: a first bottom die and a second bottom die on a package substrate, wherein the first bottom die is adjacent to the second bottom die; a plurality of first top dies on the first bottom die, and a plurality of second top dies on the second bottom die; a pedestal on a region of a top surface of the first bottom die and a top surface of the second bottom die, wherein the pedestal is comprised of a high thermal conductive material; and a TIM on the plurality of first top dies, the plurality of second top dies, and the pedestal.

In example 2, the subject matter of example 1 can optionally include that the pedestal is on a periphery region of the top surface of the first bottom die and the top surface of the second bottom die.

In example 3, the subject matter of examples 1-2 can optionally include that the high thermal conductive material of the pedestal is comprised of a STIM, an indium STIM, a metallic TIM, or a PTIM, and wherein the TIM is comprised of a first high thermal conductive material, and wherein a portion of the pedestal is positioned between the first and second bottom dies.

In example 4, the subject matter of examples 1-3 can optionally include that the high thermal conductive material of the pedestal is substantially similar to the first high thermal conductive material of the TIM, or wherein the high thermal conductive material of the pedestal is different from the first high thermal conductive material of the TIM.

In example 5, the subject matter of examples 1-4 can optionally include the pedestal includes a plurality of posts, wherein the plurality of posts are positioned directly on the periphery regions of the top surfaces of the first and second bottom dies, and wherein at least one of the plurality of posts is positioned directly on both of the periphery regions of the top surfaces of the first and second bottom dies; an encapsulation layer on the first and second bottom dies, wherein the encapsulation layer surrounds the plurality of first top dies, the plurality of second top dies, and the plurality of posts; an integrated heat spreader (IHS) on the TIM and the package substrate, wherein the plurality of posts thermally couple the periphery regions of the top surfaces of the first and second bottom dies to the IHS, and wherein the TIM is positioned between the first and second top dies and the IHS; a bridge in the package substrate; and an adhesive layer couples the package substrate to the first and second bottom dies, wherein the bridge of the package substrate couples the first bottom die to the second bottom die, and wherein the first and second bottom dies include a plurality of interconnects.

In example 6, the subject matter of examples 1-5 can optionally include that the plurality of posts of the pedestals are separated by the encapsulation layer, wherein the plurality of posts are comprised of one or more different shapes, and wherein the plurality of posts have tapered sidewalls, substantially vertical sidewalls, or rounded sidewalls.

In example 7, the subject matter of examples 1-6 can optionally include the top surfaces of the first and second top dies are substantially coplanar to a top surface of the encapsulation layer, and wherein the encapsulation layer is directly on the top surfaces of the first and second bottom dies.

In example 8, the subject matter of examples 1-7 can optionally include that the plurality of posts have a thickness that is substantially equal to a thickness of the plurality of first and second top dies, and wherein the plurality of posts are positioned adjacent to the first and second top dies.

In example 9, the subject matter of examples 1-8 can optionally include one or more dams directly coupled to the plurality of posts and the package substrate.

Example 10 is a semiconductor package, comprising: a first bottom die and a second bottom die on a package substrate, wherein the first bottom die is adjacent to the second bottom die; a plurality of first top dies on the first bottom die, and a plurality of second top dies on the second bottom die; a pedestal on a top surface of the first bottom die and a top surface of the second bottom die, wherein the pedestal includes a plurality of posts, wherein the plurality of posts are comprised of a high thermal conductive material, wherein the plurality of posts are directly on a periphery region of the top surface of the first bottom die and the top surface of the second bottom die; an encapsulation layer on the first and second bottom dies, wherein the encapsulation layer surrounds the plurality of first top dies, the plurality of second top dies, and the plurality of posts; a TIM on the plurality of first top dies, the plurality of second top dies, the encapsulation layer, and the plurality of posts; and an IHS on the TIM and the package substrate, wherein the plurality of posts thermally couple the periphery regions of the top surfaces of the first and second bottom dies to the IHS.

In example 11, the subject matter of example 10 can optionally include that the high thermal conductive material of the plurality of posts is comprised of a STIM, an indium STIM, a metallic TIM, or a PTIM.

In example 12, the subject matter of examples 10-11 can optionally include that the TIM is comprised of a first high thermal conductive material, and wherein one or more of the plurality of posts are positioned between the first and second bottom dies.

In example 13, the subject matter of examples 10-12 can optionally include that the high thermal conductive material of the plurality of posts is substantially similar to the first high thermal conductive material of the TIM, or wherein the high thermal conductive material of the plurality of posts is different from the first high thermal conductive material of the TIM.

In example 14, the subject matter of examples 10-13 can optionally include a bridge in the package substrate; a plurality of dams directly coupled to the plurality of posts and the package substrate; and an adhesive layer couples the package substrate to the first and second bottom dies, wherein the bridge of the package substrate couples the first bottom die to the second bottom die, and wherein the first and second bottom dies include a plurality of interconnects.

In example 15, the subject matter of examples 10-14 can optionally include that the plurality of posts of the pedestals are separated by the encapsulation layer, wherein the plurality of posts are comprised of one or more different shapes, and wherein the plurality of posts have tapered sidewalls, substantially vertical sidewalls, or rounded sidewalls.

In example 16, the subject matter of examples 10-15 can optionally include that the top surfaces of the first and second top dies are substantially coplanar to a top surface of the encapsulation layer, and wherein the encapsulation layer is directly on the top surfaces of the first and second bottom dies.

In example 17, the subject matter of examples 10-16 can optionally include that the plurality of posts have a thickness that is substantially equal to a thickness of the plurality of first and second top dies, and wherein the plurality of posts are positioned adjacent to the first and top second dies.

In example 18, the subject matter of examples 10-17 can optionally include that the plurality of posts are positioned directly on the periphery regions of the top surfaces of the first and second bottom dies, and wherein the one or more of the plurality of posts are positioned directly on both of the periphery regions of the top surfaces of the first and second bottom dies.

Example 19 is a method to form a semiconductor package, comprising: disposing a first bottom die and a second bottom die on a package substrate, wherein the first bottom die is adjacent to the second bottom die; disposing a plurality of first top dies on the first bottom die, and a plurality of second top dies on the second bottom die; disposing an encapsulation layer over the first and second bottom dies, wherein the encapsulation layer surrounds the plurality of first top dies and the plurality of second top dies, and wherein the plurality of first and second top dies have top surfaces that are substantially coplanar to a top surface of the encapsulation layer; patterning the encapsulation layer to form a plurality of trenches into the encapsulation layer, wherein the plurality of trenches expose a region of the top surfaces of the first and second bottom dies; disposing a TIM over the plurality of first top dies, the plurality of second top dies, the plurality of trenches, and the encapsulation layer, wherein the TIM is heated and flows into the plurality of trenches to form a pedestal directly on the region of the top surfaces of the first and second bottom dies, wherein a portion of the pedestal is positioned between the first and second bottom dies, wherein one or more portions of the pedestal are surrounded by the encapsulation layer, and wherein the TIM and the pedestals are comprised of a high thermal conductive material; and disposing an IHS over the TIM and the package substrate, wherein the pedestal thermally couples the periphery region of the top surfaces of the first and second bottom dies to the IHS.

In example 20, the subject matter of example 19 can optionally include that the pedestal is on a periphery region of the top surface of the first bottom die and the top surface of the second bottom die, and wherein the high thermal conductive material of the pedestal and the TIM is comprised of a STIM, an indium STIM, a metallic TIM, or a PTIM.

In example 21, the subject matter of examples 19-20 can optionally include disposing a bridge in the package substrate; and coupling the package substrate to the first and second bottom dies with an adhesive layer, wherein the bridge of the package substrate couples the first bottom die to the second bottom die, and wherein the first and second bottom dies include a plurality of interconnects.

In example 22, the subject matter of examples 19-21 can optionally include that the pedestal includes a plurality of posts, wherein the plurality of posts are positioned directly on the periphery regions of the top surfaces of the first and second bottom dies, wherein at least one of the plurality of posts is positioned directly on both of the periphery regions of the top surfaces of the first and second bottom dies, wherein the plurality of posts of the pedestals are separated by the encapsulation layer, wherein the plurality of posts are comprised of one or more different shapes, and wherein the plurality of posts have tapered sidewalls, substantially vertical sidewalls, or rounded sidewalls.

In example 23, the subject matter of examples 19-22 can optionally include that the top surfaces of the first and second top dies are substantially coplanar to a top surface of the encapsulation layer, and wherein the encapsulation layer is directly on the top surfaces of the first and second bottom dies.

In example 24, the subject matter of examples 19-23 can optionally include that the plurality of posts have a thickness that is substantially equal to a thickness of the plurality of first and second top dies, and wherein the plurality of posts are positioned adjacent to the first and second top dies.

In example 25, the subject matter of examples 19-24 can optionally include one or more dams directly coupled to the plurality of posts and the package substrate.

In the foregoing specification, methods and apparatuses have been described with reference to specific exemplary embodiments thereof. It will be evident that various modifications may be made thereto without departing from the broader spirit and scope. The specification and drawings are, accordingly, to be regarded in an illustrative sense rather than a restrictive sense.

What is claimed is:

1. A semiconductor package, comprising:
   a first bottom die and a second bottom die on a package substrate, wherein the first bottom die is adjacent to the second bottom die;
   a plurality of first top dies on the first bottom die, and a plurality of second top dies on the second bottom die;
   a pedestal on a region of a top surface of the first bottom die and a top surface of the second bottom die, wherein the pedestal is comprised of a conductive material selected from the group consisting of a metallic thermal interface material (TIM) and a polymer TIM; and
   a thermal interface material (TIM) on the plurality of first top dies, the plurality of second top dies, and the pedestal.

2. The semiconductor package of claim 1, wherein the pedestal is on a periphery region of the top surface of the first bottom die and the top surface of the second bottom die.

3. The semiconductor package of claim 1, wherein the conductive material of the pedestal is comprised of a solder TIM (STIM) or an indium TIM, and wherein a portion of the pedestal is positioned between the first and second bottom dies.

4. The semiconductor package of claim 3, wherein the conductive material of the pedestal is substantially similar to the TIM on the plurality of first top dies, the plurality of second top dies, and the pedestal.

5. The semiconductor package of claim 2, the pedestal includes a plurality of posts, wherein one or more of the plurality of posts are positioned directly on the periphery regions of the top surfaces of the first and second bottom dies, the semiconductor package further comprising:
   an encapsulation layer on the first and second bottom dies, wherein the encapsulation layer surrounds the plurality of first top dies, the plurality of second top dies, and the plurality of posts;
   an integrated heat spreader (IHS) on the TIM, wherein the plurality of posts thermally couple the periphery regions of the top surfaces of the first and second bottom dies to the IHS, and wherein the TIM is positioned between the plurality of first and second top dies and the IHS;
   a bridge in the package substrate; and an adhesive layer that couples the package substrate to the first and second bottom dies, wherein the bridge of the package substrate couples the first bottom die to the second bottom die, and wherein the first and second bottom dies include a plurality of interconnects.

6. The semiconductor package of claim 5, wherein one or more of the plurality of posts are separated by the encapsulation layer, wherein the plurality of posts are comprised of one or more different shapes, wherein the one or more different shapes of the plurality of posts include rectangular posts, oval posts, square posts, L-shaped posts, trapezoidal posts, or circular posts, and wherein the plurality of posts have tapered sidewalls, substantially vertical sidewalls, or rounded sidewalls from a plan view perspective.

7. The semiconductor package of claim 5, wherein the top surfaces of the plurality of first and second top dies are substantially coplanar to a top surface of the encapsulation layer and a top surface of the pedestal, and wherein the encapsulation layer is directly on the top surfaces of the first and second bottom dies.

8. The semiconductor package of claim 5, wherein the plurality of posts have a thickness that is substantially equal to or greater than a thickness of the plurality of first and second top dies, and wherein the plurality of posts are positioned adjacent to the plurality of first and second top dies.

9. The semiconductor package of claim 5, further comprising one or more dams directly coupled to the plurality of posts and the package substrate.

10. A semiconductor package, comprising:
   a first bottom die and a second bottom die on a package substrate, wherein the first bottom die is adjacent to the second bottom die;
   a plurality of first top dies on the first bottom die, and a plurality of second top dies on the second bottom die;
   a pedestal on the first bottom die and the second bottom die, wherein the pedestal includes a plurality of posts, wherein the plurality of posts are comprised of a conductive material selected from the group consisting of a metallic thermal interface material (TIM) and a polymer TIM, and wherein one or more of the plurality of posts are directly on a periphery region of a top surface of the first bottom die and a top surface of the second bottom die;
   an encapsulation layer on the first and second bottom dies, wherein the encapsulation layer surrounds the plurality of first top dies, the plurality of second top dies, and the plurality of posts;
   a thermal interface material (TIM) on the plurality of first top dies, the plurality of second top dies, the encapsulation layer, and the plurality of posts; and
   an integrated heat spreader (IHS) on the TIM, wherein the plurality of posts thermally couple the periphery region of the top surfaces of the first and second bottom dies to the IHS.

11. The semiconductor package of claim 10, wherein the conductive material of the plurality of posts is comprised of a solder TIM (STIM) or an indium TIM, and wherein one or more of the plurality of posts are positioned between the first and second bottom dies.

12. The semiconductor package of claim 10, wherein the TIM is comprised of a first conductive material.

13. The semiconductor package of claim 12, wherein the conductive material of the plurality of posts is substantially similar to the first conductive material of the TIM, or wherein the conductive material of the plurality of posts is different from the first conductive material of the TIM.

14. The semiconductor package of claim 10, further comprising:
   a bridge in the package substrate;
   a plurality of dams directly coupled to the plurality of posts and the package substrate; and
   an adhesive layer that couples the package substrate to the first and second bottom dies, wherein the bridge of the package substrate couples the first bottom die to the second bottom die, and wherein the first and second bottom dies include a plurality of interconnects.

15. The semiconductor package of claim 10, wherein one or more of the plurality of posts of the pedestal are separated by the encapsulation layer, wherein the plurality of posts are comprised of one or more different shapes, wherein the one or more different shapes of the plurality of posts include rectangular posts, oval posts, square posts, L-shaped posts, trapezoidal posts, or circular posts, and wherein the plurality of posts have tapered sidewalls, substantially vertical sidewalls, or rounded sidewalls from a plan view perspective.

16. The semiconductor package of claim 10, wherein the top surfaces of the first and second top dies are substantially coplanar to a top surface of the encapsulation layer and a top surface of the plurality of posts of the pedestal, and wherein the encapsulation layer is directly on the top surfaces of the first and second bottom dies.

17. The semiconductor package of claim 10, wherein the plurality of posts have a thickness that is substantially equal to or greater than a thickness of the plurality of first and second top dies, and wherein the plurality of posts are positioned adjacent to the plurality of first and top second dies.

18. The semiconductor package of claim 10, wherein one or more of the plurality of posts are positioned directly on both of the periphery regions of the top surfaces of the first and second bottom dies, and wherein the one or more of the plurality of posts are positioned proximately to one or more of the plurality of first and second top dies.

19. A method to form a semiconductor package, comprising:
   disposing a first bottom die and a second bottom die on a package substrate, wherein the first bottom die is adjacent to the second bottom die;
   disposing a plurality of first top dies on the first bottom die, and a plurality of second top dies on the second bottom die;
   disposing an encapsulation layer over the first and second bottom dies, wherein the encapsulation layer surrounds the plurality of first top dies and the plurality of second top dies, and wherein the plurality of first and second top dies have top surfaces that are substantially coplanar to a top surface of the encapsulation layer;
   patterning the encapsulation layer to form a plurality of trenches into the encapsulation layer, wherein the plurality of trenches expose a region of a top surface of the first bottom die and a top surface of the second bottom die;
   disposing a thermal interface material (TIM) over the plurality of first top dies, the plurality of second top dies, the plurality of trenches, and the encapsulation layer, wherein the TIM is heated and flows into the plurality of trenches to form a pedestal directly on the region of the top surfaces of the first and second bottom dies, wherein one or more portions of the pedestal are surrounded by the encapsulation layer, and wherein the TIM and the pedestals are comprised of a conductive material selected from the group consisting of a metallic thermal interface material (TIM) and a polymer TIM; and disposing an integrated heat spreader (IHS) over the TIM, wherein the pedestal thermally couples the region of the top surfaces of the first and second bottom dies to the IHS.

20. The method of claim 19, wherein the pedestal is on a periphery region of the top surface of the first bottom die and the top surface of the second bottom die, and wherein the conductive material of the pedestal and the TIM is comprised of a solder TIM (STIM) or an indium TIM.

21. The method of claim 19, further comprising:
disposing a bridge in the package substrate; and
coupling the package substrate to the first and second bottom dies with an adhesive layer, wherein the bridge of the package substrate couples the first bottom die to the second bottom die, and wherein the first and second bottom dies include a plurality of interconnects.

22. The method of claim 20, wherein a portion of the pedestal is positioned on and between the first and second bottom dies, wherein the pedestal includes a plurality of posts, wherein one or more of the plurality of posts are positioned directly on the periphery regions of the top surfaces of the first and second bottom dies, wherein at least one of the plurality of posts is positioned directly on both of the periphery regions of the top surfaces of the first and second bottom dies, wherein one or more of the plurality of posts of the pedestals are separated by the encapsulation layer, wherein the plurality of posts are comprised of one or more different shapes, wherein the one or more different shapes of the plurality of posts include rectangular posts, oval posts, square posts, L-shaped posts, trapezoidal posts, or circular posts, and wherein the plurality of posts have tapered sidewalls, substantially vertical sidewalls, or rounded sidewalls from a plan view perspective.

23. The method of claim 19, wherein the top surfaces of the plurality of first and second top dies are substantially coplanar to a top surface of the encapsulation layer and a top surface of the pedestal, and wherein the encapsulation layer is directly on the top surfaces of the first and second bottom dies.

24. The method of claim 22, wherein the plurality of posts have a thickness that is substantially equal to or greater than a thickness of the plurality of first and second top dies, and wherein the plurality of posts are positioned adjacent to the plurality of first and second top dies.

25. The method of claim 22, further comprising one or more dams directly coupled to the plurality of posts and the package substrate.

* * * * *